United States Patent
Miyazaki et al.

(10) Patent No.: US 9,997,611 B2
(45) Date of Patent: Jun. 12, 2018

(54) GRAPHENE WIRING STRUCTURE AND METHOD FOR MANUFACTURING GRAPHENE WIRING STRUCTURE

(71) Applicant: KABUSHIKI KAISHA TOSHIBA, Minato-ku (JP)

(72) Inventors: Hisao Miyazaki, Yokohama (JP);
Tadashi Sakai, Yokohama (JP);
Masayuki Katagiri, Tsukuba (JP);
Yuichi Yamazaki, Inagi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 15/390,899

(22) Filed: Dec. 27, 2016

(65) Prior Publication Data
US 2017/0256499 A1    Sep. 7, 2017

(30) Foreign Application Priority Data
Mar. 4, 2016 (JP) .................. 2016-042270

(51) Int. Cl.
*H01L 23/52* (2006.01)
*H01L 21/4763* (2006.01)
*H01L 29/66* (2006.01)
*H01L 39/12* (2006.01)
*H01L 29/16* (2006.01)

(52) U.S. Cl.
CPC .... *H01L 29/66015* (2013.01); *H01L 29/1606* (2013.01); *H01L 39/123* (2013.01)

(58) Field of Classification Search
CPC .................. H01L 29/66015; H01L 39/123

USPC ........ 438/623, 780, 785; 257/642, 759, 761, 257/764
See application file for complete search history.

(56) References Cited

U.S. PATENT DOCUMENTS

| | | | |
|---|---|---|---|
| 6,787,122 B2 | 9/2004 | Zhou | |
| 9,713,794 B2 * | 7/2017 | Choi | B01D 71/021 |
| 2002/0193040 A1 | 12/2002 | Zhou | |
| 2014/0284798 A1 | 9/2014 | Miyazaki et al. | |
| 2014/0284799 A1 | 9/2014 | Katagiri et al. | |
| 2015/0061131 A1 | 3/2015 | Saito et al. | |
| 2015/0061133 A1 | 3/2015 | Isobayashi et al. | |
| 2015/0235960 A1 | 8/2015 | Sato et al. | |

(Continued)

FOREIGN PATENT DOCUMENTS

| | | |
|---|---|---|
| JP | 11-73959 A | 3/1999 |
| JP | 2004-534662 | 11/2004 |

(Continued)

OTHER PUBLICATIONS

J. Walter et al., "Stability of Graphite Intercalation Compounds With Tacl$_5$ or Nbcl$_5$ Against Water or Dilute Acids—A Study With Xrd, Sem/Eds and Electron Microprobe Analysis (EMPA)", Carbon, vol. 33, (8), 1995, 7 pgs.

(Continued)

*Primary Examiner* — Calvin Lee
(74) *Attorney, Agent, or Firm* — Oblon, McClelland, Maier & Neustadt, L.L.P.

(57) ABSTRACT

A graphene wiring structure of an embodiment has a multilayered graphene having a plurality of planar graphene sheets laminated, and a first interlayer substance being a metal oxyhalide between the plurality of planar graphene sheets.

18 Claims, 10 Drawing Sheets

(56) References Cited

U.S. PATENT DOCUMENTS

2015/0279747 A1 10/2015 Kondo et al.
2016/0284646 A1 9/2016 Sakai et al.

FOREIGN PATENT DOCUMENTS

| JP | 2004-534662 A | 11/2004 |
| JP | 2014-96411 | 5/2014 |
| JP | 2014-183211 | 9/2014 |
| JP | 2014-183212 | 9/2014 |
| JP | 5583237 | 9/2014 |
| JP | 2014-207485 | 10/2014 |
| JP | 2015-50209 | 3/2015 |
| JP | 2015-50305 | 3/2015 |
| JP | 2015-61031 | 3/2015 |
| JP | 2015-61042 | 3/2015 |
| JP | 5701920 | 4/2015 |
| JP | 2015-191937 A | 11/2015 |
| JP | 5944547 | 7/2016 |

OTHER PUBLICATIONS

J. Walter et al., "$BiCl_3$-graphite: an environmentally stable low-dimensional compound", Carbon, (37), 1999, 8 pgs.
M. Inagaki et al., "Stability of $MoCl_5$-GICs in various solutions", Synthetic Metals, (94), 1998, 4 pgs.

\* cited by examiner

GRAPHENE WIRING STRUCTURE AND METHOD FOR MANUFACTURING GRAPHENE WIRING STRUCTURE

CROSS-REFERENCE TO RELATED APPLICATION

This application is based upon and claims the benefit of priority from Japanese Patent Application No. 2016-042270, filed on Mar. 4, 2016; the entire contents of which are incorporated herein by reference.

FIELD

Embodiments described herein relate to a graphene wiring structure and a method for manufacturing graphene wiring structure.

BACKGROUND

A multilayered wiring in a chip is required to be finer along with higher integration and miniaturization in a memory and the like, and it is expected that the most recent flash memory reaches a half pitch of 10 nm or less around 2020. On the other hand, resistivity is rapidly increasing along with the miniaturization due to an increase in inelastic scattering of a generally-used metal wiring of Cu or the like, and is reaching the limit of the material. To the contrary, it is reported that a nano-carbon material such as graphene or carbon nanotube (CNT) has a remarkably longer mean free path or higher mobility also in a finer area than the metals, which is expected as a next-generation fine wiring material. In particular, graphene may form a fine-width wiring in a lithography process well compatible with the existing LSI (large Scale Integration) process, and fine-width integrated wiring based on multilayered graphene by CVD (Chemical Vapor Deposition) is increasingly developed.

When a multilayered graphene itself is only thinned, the thinned multilayered graphene has high resistance, and is insufficient to be used as wiring. Therefore, development for reducing resistance by inserting an interlayer substance between layers of the multilayered graphene (intercalation) has been performed. Intercalation itself is a technique which has been studied widely for graphite for thirty years or more. Many interlayer substances are known, and an effect of reducing resistance by the interlayer substances has been indicated. However, when this intercalation is applied to a graphene having a fine width, doping strength is lowered with fining, and an effect of reducing resistance cannot be obtained disadvantageously. In addition, a graphene formed by low temperature CVD or the like required for integration has a difficulty in obtaining sufficient doping strength independent of a line width, disadvantageously.

DETAILED DESCRIPTION

A graphene wiring structure of an embodiment has a multilayered graphene having a plurality of planar graphene sheets laminated, and a first interlayer substance being a metal oxyhalide between the plurality of planar graphene sheets.

First Embodiment

A graphene wiring structure according to a first embodiment includes a multilayered graphene having planar graphene sheets laminated and a first interlayer substance between the planar graphene sheets. The first interlayer substance is a metal oxyhalide.

Figure 1:
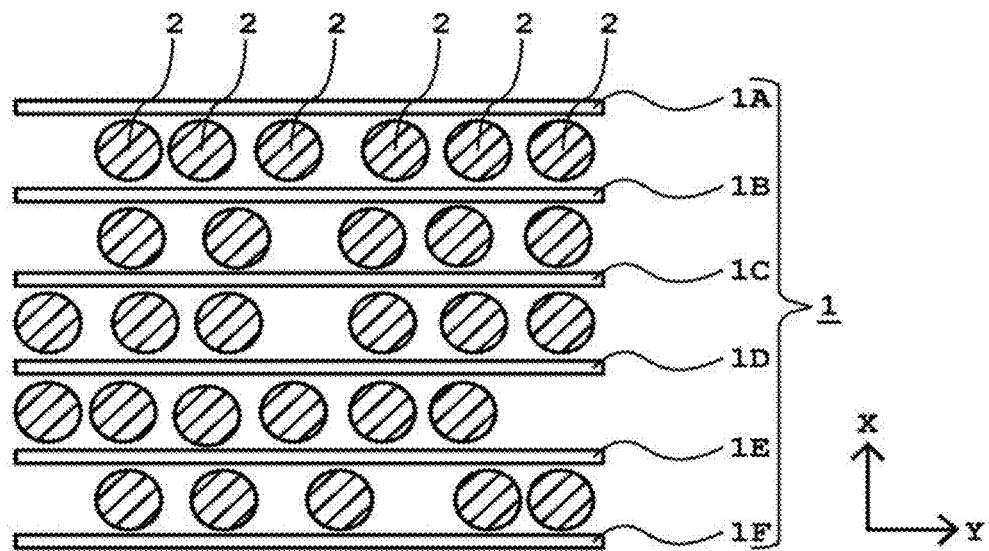
FIG. 1 is a schematic cross-sectional view of a graphene wiring structure according to an embodiment.

FIG. 1 illustrates a schematic cross-sectional view of the graphene wiring structure according to the first embodiment. The graphene wiring structure in FIG. 1 includes a multilayered graphene 1 having a plurality of planar graphene sheets 1A to 1F laminated and a first interlayer substance 2 existing between the plurality of planar graphene sheets. A lamination direction of the planar graphene sheets 1A to 1F is referred to as an X direction. A width direction of the planar graphene sheets 1A to 1F is referred to as a Y direction. A Z direction is not illustrated in FIG. 1, but is a direction perpendicular to an X-Y plane. The Z direction is a wiring length direction of the multilayered graphene 1.

The multilayered graphene 1 having a plurality of planar graphene sheets laminated is obtained by laminating two or more planar graphene sheets such that sheet surfaces thereof face each other. For example, the multilayered graphene 1 has graphene sheets with a planar portion laminated, such as graphene nanoribbon, and does not include a multilayered graphene having graphene sheets without a planar portion laminated, such as multilayered carbon nanotube. The planar graphene sheets 1A to 1F are each an atomic layer in which carbon atoms having a hexagonal lattice structure are bonded to each other in a Y-Z plane direction in FIG. 1. Each of the planar graphene sheets may partially contain carbon atoms having a pentagonal lattice structure, carbon atoms having a heptagonal lattice structure, a grain boundary (except for an end of the graphene sheet), and a defect in addition to the hexagonal lattice structure. A compound to suppress leakage of an interlayer substance may be bonded to an end of each of the planar graphene sheets. Each of the planar graphene sheets may be a single atomic layer formed of carbon atoms or a single atomic layer formed of carbon atoms in which a part of carbon atoms is bonded to an oxygen atom, a nitrogen atom, or the like. The multilayered graphene 1 preferably has a wiring shape. Both ends of the multilayered graphene 1 having a wiring shape in the wiring length direction (Z direction) are electrically connected to an electrode such as a semiconductor element.

For example, the graphene wiring structure according to the first embodiment is used for wiring in a semiconductor device. The graphene wiring structure according to the first embodiment is preferably used for fine wiring (conductive portion) serving as a signal transmission line in a semiconductor device. Examples of a semiconductor device employing the graphene wiring structure according to the first embodiment include a processor such as a micro-processing unit (MPU) or a graphic processing unit (GPU). Examples of the semiconductor device employing the graphene wiring structure according to the first embodiment further include a storage device such as a dynamic random access memory (DRAM), a NAND flash memory, or a cross-point memory. Examples of the semiconductor device employing the graphene wiring structure according to the first embodiment further include a field programmable gate array (FPGA), a complex programmable logic device (CPLD), and a system on chip (SoC) including the above processors, storage devices, and the like.

The multilayered graphene 1 has planar graphene sheets processed into a wiring shape laminated. The multilayered graphene 1 according to the first embodiment does not include a graphene such as carbon nanotube having no planar shape. The wiring width of a graphene wiring structure 100, that is, the wiring width of the multilayered graphene 1 is more effective in a case of 3 μm or less causing an interlayer substance to leak out easily. Specifically, the wiring width is preferably 20 nm or less required for graphene wiring structure, or 10 nm or less (for example, 5 nm or more and 10 nm or less) because an effect for suppressing leakage of a first interlayer substance 2 according to the first embodiment is remarkable. In the graphene wiring structure according to the first embodiment, many interlayer substances exist even in an end region (region from an end to 5 nm apart from the end in a central direction) of the multilayered graphene 1 in which the interlayer substances easily leak out. Therefore, the graphene wiring structure according to the first embodiment has low resistance regardless of the wiring width thereof. The wiring width of the multilayered graphene 1 can be measured by observing the multilayered graphene 1 using a scanning electron microscope or a transmission electron microscope.

The multilayered graphene 1 according to the first embodiment is a laminate obtained by laminating about 10 to 100 planar graphene sheets, for example. The thickness of the multilayered graphene 1 depends on the lamination number of the planar graphene sheets and the kind of an interlayer compound, but is typically 5 nm or more and 50 nm or less. The multilayered graphene 1 has an effect of the first embodiment whether the multilayered graphene 1 is a single crystalline graphene or a polycrystalline graphene. When the multilayered graphene 1 is a polycrystalline graphene, the multilayered graphene 1 is easily subjected to an oxidation, nitridation, or carbonization treatment due to a defect or a grain boundary thereof. Therefore, the multilayered graphene 1 is more preferably a polycrystalline graphene from a viewpoint of suppressing leakage of the first interlayer substance 2. For example, the polycrystalline graphene is manufactured by a low temperature CVD method.

The first interlayer substance 2 exists between layers of the multilayered graphene 1. The first interlayer substance 2 is preferably a metal oxyhalide (compound formed of a metal, oxygen, and a halogen). A metal halide imparts conductivity to the multilayered graphene 1 due to presence thereof between layers of the multilayered graphene 1. However, the metal halide has low stability, and therefore easily leaks out from between layers of the multilayered graphene 1. A metal oxide exists stably between layers of the multilayered graphene 1 due to high stability, but does not contribute to improving conductivity of the multilayered graphene 1. A metal oxyhalide has a property between a metal halide and a metal oxide. Therefore, by using a metal oxyhalide for the first interlayer substance 2, an interlayer substance to impart conductivity to the multilayered graphene 1 can exist stably between layers of the multilayered graphene 1. Existence of a metal oxyhalide between layers of the multilayered graphene 1 preferably reduces wiring resistance of the graphene wiring structure.

A metal oxyhalide as the first interlayer substance 2 exists between layers of the multilayered graphene 1. The phrase "between layers of the multilayered graphene 1" means between planar graphene sheets. A distance between planar graphene sheets having no interlayer substance between layers thereof and facing each other in the multilayered graphene 1 is 0.335 nm. Existence of an interlayer substance between layers of a multilayered graphene increases a distance between planar graphene sheets facing each other typically to 0.7 nm to 1.0 nm.

An image obtained by photographing a cross section of the graphene wiring structure with a transmission electron microscope at a magnification ratio of 2,000,000 times is observed. By confirming a laminate having planar layers laminated and a black indefinitely-shaped pattern different from a lamination pattern, overlapping the laminate in the photographed image, existence of an interlayer substance (the first interlayer substance 2 or a second interlayer substance 3) in the multilayered graphene 1 can be confirmed. An image obtained by photographing a cross section of the graphene wiring structure with a scanning transmission electron microscope (STEM) at a magnification ratio of 1,000,000 times is observed. An interlayer substance can be identified by analysis by energy dispersive X-ray spectroscopy (EDX). In order to suppress leakage of an interlayer substance generated when a sample for electron microscope analysis is produced and to obtain a cross section, it is preferable to cover the graphene wiring structure with a resin and to produce a cross section from the covered sample. A cross section of a sample to be photographed is a surface which includes a center of the multilayered graphene 1 and an end of the graphene wiring structure in a width direction and in which a gap between layers of the multilayered graphene 1 can be observed. When an image which has been subjected to element mapping is superimposed on a STEM image, in a region in which planar graphene sheets are laminated, existence of a point at which a metal (M1), oxygen, and a halogen all exist in a wide range between layers can be assumed to be existence of the first interlayer substance 2 between layers of the multilayered graphene 1.

For example, a metal oxyhalide is a compound (M1OHa$_x$) formed from the metal M1, oxygen (O), and a halogen Ha.

For example, the metal M1 is one or more metals selected from the group consisting of niobium (Nb), molybdenum (Mo), tantalum (Ta), tungsten (W), and bismuth (Bi). A halogen contained in the metal oxyhalide is chlorine or fluorine. The metal oxyhalide is preferably a metal oxychloride, a metal oxyfluoride, or a metal oxychloride and a metal oxyfluoride. The halogen contained in the metal oxyhalide is preferably chlorine. The metal oxyhalide may be one compound or a plurality of compounds. When the halogen is chlorine, specific examples of the metal oxyhalide include $NbOCl_3$, $MoOCl_3$, $TaOCl_3$, $WOCl_4$, $BiOCl$, $NbO_2Cl$, $MoO_2Cl$, $TaO_2Cl$, and $WO_2Cl_2$. One or more metal oxyhalides selected from the group consisting of $NbOCl_3$, $MoOCl_3$, $TaOCl_3$, $BiOCl$, $WOCl_4$, $NbO_2Cl$, $MoO_2Cl$, $TaO_2Cl$, and $WOCl_2$ preferably exist between layers of the multilayered graphene 1. When the halogen is fluorine, specific examples of the metal oxyhalide include $NbOF_3$, $MoOF_3$, $TaOF_3$, $WOF_4$, $BiOF$, $NbO_2F$, $MoO_2F$, $TaO_2F$, and $WOF_2$. One or more metal oxyhalides selected from the group consisting of $NbOF_3$, $TaOF_3$, $MoOF_4$, $WOF_4$, $BiOF$, $NbO_2F$, $TaO_2F$, $MoO_2F_2$, and $WO_2F_2$ preferably exist between layers of the multilayered graphene 1. For example, the metal oxyhalide is obtained by oxidizing a metal halide incompletely.

Figure 2:
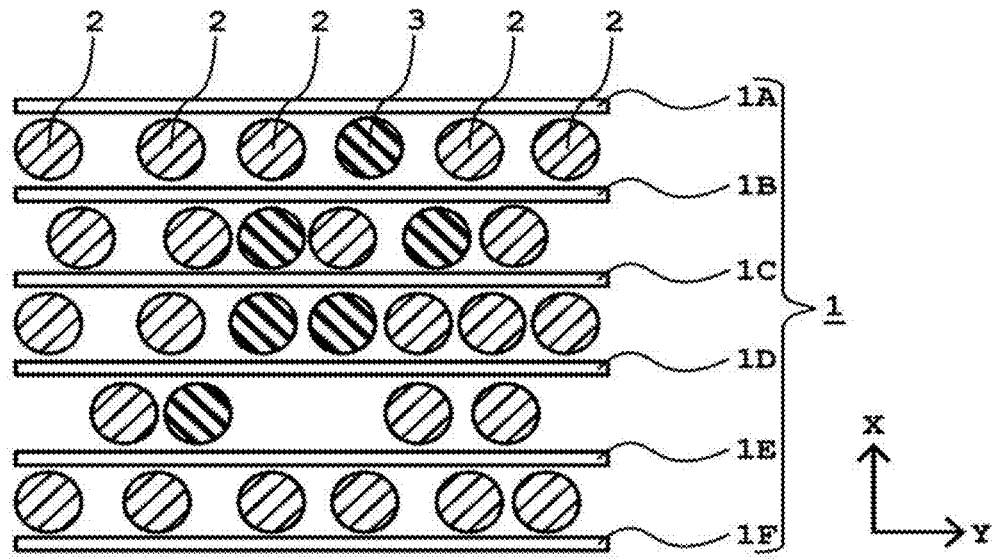
FIG. 2 is a schematic cross-sectional view of a graphene wiring structure according to an embodiment.

The second interlayer substance 3 may be contained between layers of the multilayered graphene 1 in addition to the first interlayer substance 2. Examples of the second interlayer substance 3 include a metal halide containing the metal M1. The second interlayer substance 3 has lower stability than the first interlayer substance 2 because of the unoxidized metal halide, but contributes to reducing resistance of the graphene wiring structure. In this regard, the second interlayer substance 3 preferably exists between layers of the multilayered graphene 1. FIG. 2 illustrates a schematic cross-sectional view of the graphene wiring structure in which the first interlayer substance 2 and the second interlayer substance 3 exist between layers of the multilayered graphene 1. A halogen contained in the metal halide of the second interlayer substance 3 is the same element as a halogen contained in the metal oxyhalide. A metal contained in the metal halide of the second interlayer substance 3 is the same element as the metal M1 contained in the metal oxyhalide.

For example, the metal halide of the second interlayer substance 3 is preferably a metal halide of one or more metals selected from the group consisting of Nb, Mo, Ta, Bi, and W and a halogen of chlorine or fluorine. Specifically, the metal halide of the second interlayer substance 3 is preferably at least one compound selected from the group consisting of $NbCl_5$, $MoCl_5$, $TaCl_5$, $BiCl_3$, $WCl_6$, $NbF_5$, $MoF_6$, $TaF_5$, $BiF_3$, and $WF_6$.

The first interlayer substance 2 is generated by oxidation. Oxidation easily occurs from an end between layers of the multilayered graphene 1, a defect of planar graphene sheets, or a grain boundary thereof. That is, when the second interlayer substance 3 is included, the first interlayer substance 2 at least exists in an end between layers of the multilayered graphene 1, a defect of planar graphene sheets, or the vicinity of a grain boundary thereof. The end between layers, the defect, and the grain boundary are regions where an interlayer substance comes and goes. Therefore, when the graphene wiring structure includes the second interlayer substance 3, by existence of the first interlayer substance 2 having stability in this region, the first interlayer substance 2 prevents leakage of the second interlayer substance 3. That is, the first interlayer substance 2 itself hardly leaks out from between layers of the multilayered graphene 1. When the second interlayer substance 3 also exists between layers of the multilayered graphene 1, the first interlayer substance 2 reduces leakage of the second interlayer substance 3.

Next, a method for manufacturing the graphene wiring structure according to the first embodiment will be described. The method for manufacturing the graphene wiring structure includes a step for inserting a metal halide between layers of a multilayered graphene and a step for oxidizing the multilayered graphene into which the metal halide has been inserted.

The method for manufacturing the graphene wiring structure according to the first embodiment will be described specifically using the schematic process views of FIGS. 3 to 5.

Figure 3:
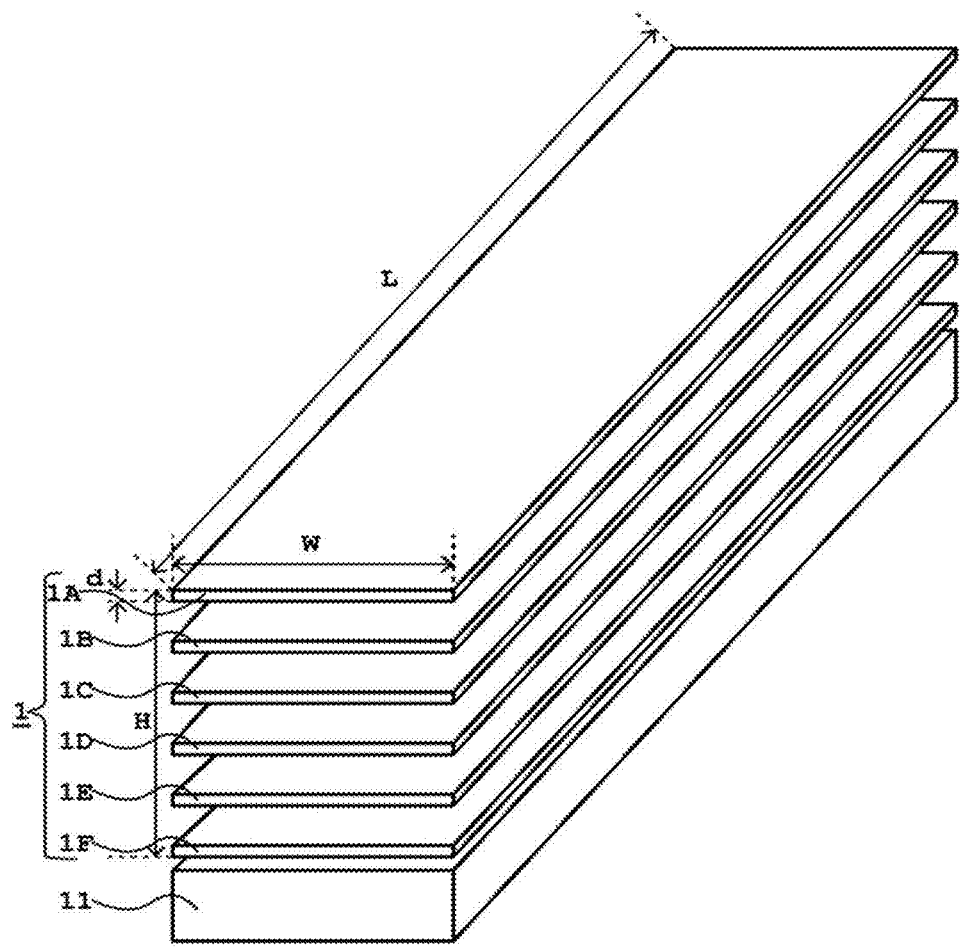
FIG. 3 is a perspective process view of a graphene wiring structure according to an embodiment.

The member illustrated in the schematic process view of FIG. 3 includes the multilayered graphene 1 having the plurality of planar graphene sheets 1A to 1F laminated on a substrate 11. For example, the multilayered graphene 1 may be obtained by growing the multilayered graphene 1 from a catalytic film provided on a substrate (not illustrated) and processing the multilayered graphene 1 into a wiring shape, may be obtained by processing the multilayered graphene 1 which has been transferred to the substrate 11 into a wiring shape, or may be obtained by transferring the multilayered graphene 1 which has been processed into a wiring shape to the substrate 11. The multilayered graphene 1 may be either a single crystalline graphene or a polycrystalline graphene. In the multilayered graphene 1 of FIG. 3, a laminate having the single crystalline graphene sheets 1A to 1F having no defect or grain boundary laminated is exemplified. As the substrate 11, an insulating substrate such as Si is used suitably. However, the substrate 11 is not particularly limited as long as holding the multilayered graphene 1.

Figure 4:
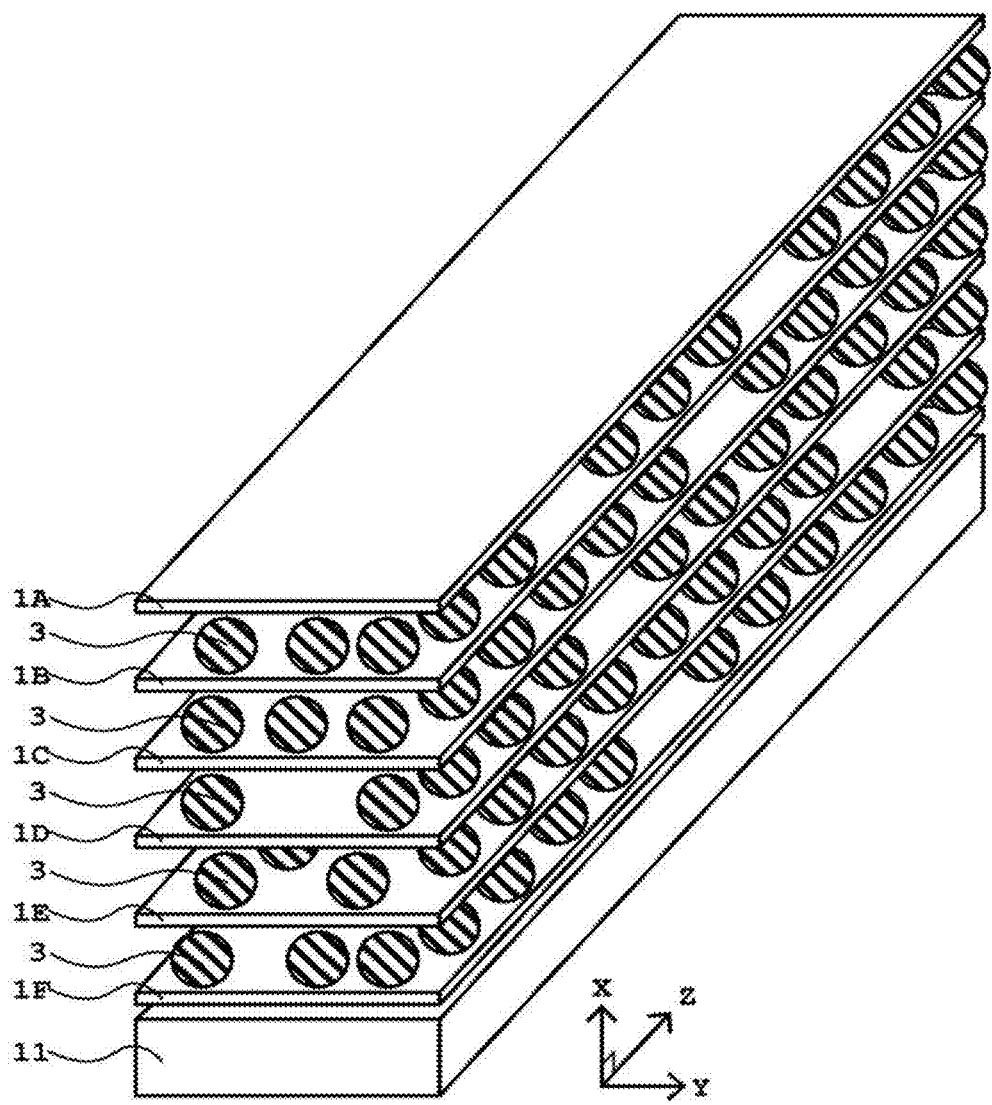
FIG. 4 is a perspective process view of a graphene wiring structure according to an embodiment.

The schematic process view of FIG. 4 is a schematic cross-sectional view of the member illustrated in the schematic process view of FIG. 3 in a step for inserting the second interlayer substance (metal halide) 3 between layers of the multilayered graphene 1 (intercalation). In order to insert the metal halide 3 between layers of the multilayered graphene 1, the multilayered graphene 1 is preferably treated in an atmosphere containing the metal halide 3. For example, a temperature at which the graphene 1 is treated in the atmosphere containing the metal halide 3 is preferably 200° C. or higher and 300° C. or lower. Time for treating the multilayered graphene 1 in the atmosphere containing the metal halide 3 is not particularly limited. In order to insert a large amount of the metal halide 3 between layers of the multilayered graphene 1, the treatment time is preferably 30 minute or more. The atmosphere containing the metal halide 3 may contain a carrier gas such as an inert gas or a halogen gas. By inserting the metal halide 3 between layers of the multilayered graphene 1 (intercalation), a distance between layers of the multilayered graphene 1 (distance between planar graphene sheets facing each other) is increased.

Figure 5:
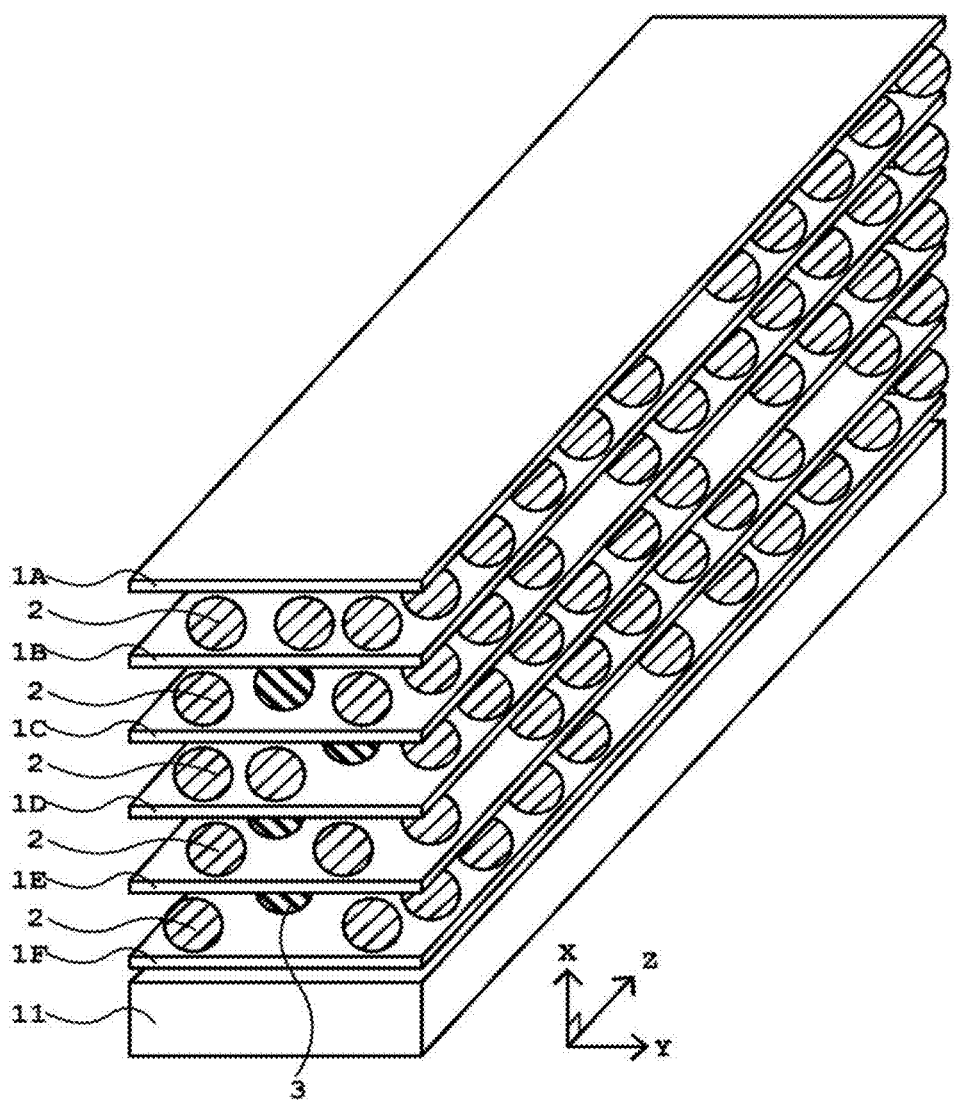
FIG. 5 is a perspective process view of a graphene wiring structure according to an embodiment.

FIG. 5 is a schematic process view when the member illustrated in the schematic process view of FIG. 4 is oxidized. FIG. 5 is a schematic cross-sectional view of the member in a step for generating the first interlayer substance (metal oxyhalide) 2 from the metal halide 3 by oxidizing the metal halide 3 which has been inserted between layers of the multilayered graphene 1. After insertion of the metal halide 3 between layers of the multilayered graphene 1 before this step, when the atmosphere containing the metal halide 3 of a high temperature is changed to an atmosphere of normal temperature or lower, such as the atmospheric air, a large amount of the metal halide 3 leaks out from between layers of the multilayered graphene 1 unfavorably. Therefore, it is preferable to replace the atmosphere containing the metal halide 3 with an oxidizing atmosphere while the temperature is maintained at 200° C. or higher and 300° C. or lower similarly.

The oxidizing atmosphere is an atmosphere containing at least one selected from the group consisting of oxygen, ozone, and water. The oxygen may be an oxygen radical. By further oxidizing the generated metal oxyhalide 2, a metal oxide is generated. Note that the metal oxide here does not include a metal oxyhalide but is a compound formed from a metal and oxygen. The oxidizing atmosphere enters the multilayered graphene 1 from an end between layers of the multilayered graphene 1, a defect of the planar graphene sheets, or a grain boundary thereof, and spreads from these regions toward a deep portion of the multilayered graphene 1. Then, oxygen contained in the oxidizing atmosphere reacts with the metal halide 3 to generate the metal oxyhalide 2. A metal oxide may be generated partially. However, when all of the generated metal oxyhalide 2 is further oxidized, the metal oxyhalide 2 between layers of the multilayered graphene 1 is completely oxidized unfavorably. Therefore, when the multilayered graphene 1 having a metal halide inserted between layers thereof is treated with an atmosphere containing an oxygen radical or ozone having a high oxidation power, it is only required to lower the temperature or to reduce treatment time. The metal halide 3 may remain partially because of no occurrence of an oxidation reaction. The schematic process view of FIG. 5 illustrates a form in which the metal halide 3 remains. When the metal oxyhalide is further oxidized, a generated metal oxide becomes a third interlayer substance 4.

When an oxidation treatment is performed, a selected interlayer region may be oxidized by forming a mask. A region in which the first interlayer substance 2 is formed can be thereby selected.

Second Embodiment

Figure 6:
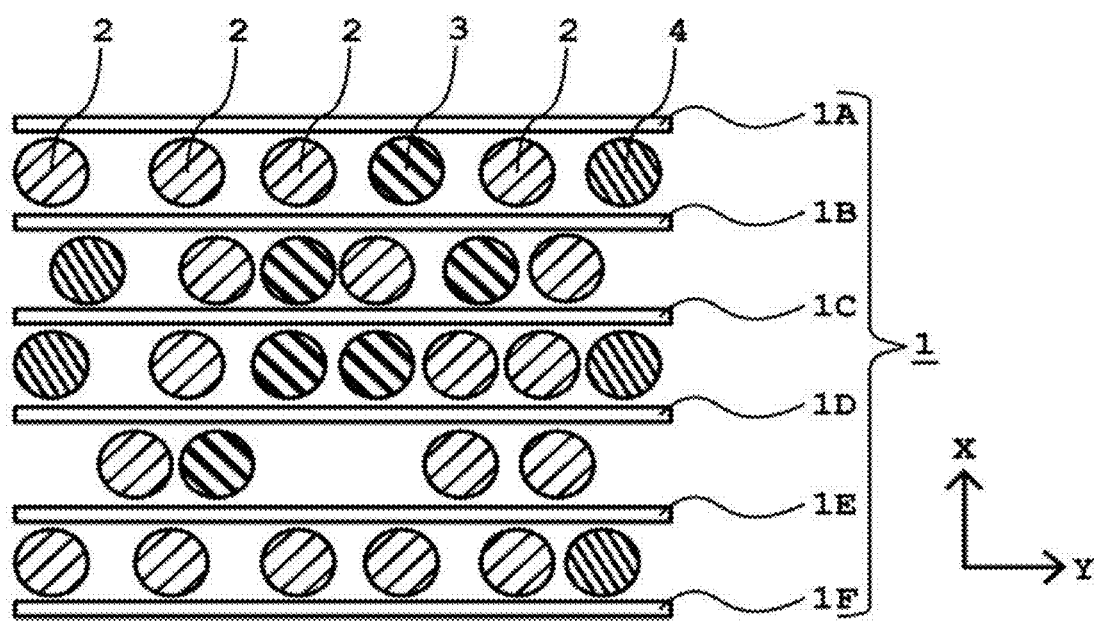
FIG. 6 is a schematic cross-sectional view of a graphene wiring structure according to an embodiment.

A second embodiment is a modified example of the graphene wiring structure of the first embodiment. The graphene wiring structure according to the second embodiment includes a multilayered graphene 1, a first interlayer substance 2 existing between layers of the multilayered graphene 1, a second interlayer substance 3, and a third interlayer substance 4. FIG. 6 illustrates a schematic cross-sectional view of the graphene wiring structure according to the second embodiment. The multilayered graphene 1, the first interlayer substance 2, and the second interlayer substance 3 according to the second embodiment are common to those according to the first embodiment, and therefore description thereof will be omitted.

The third interlayer substance 4 is an oxide of a metal M1 (one or more metals selected from the group consisting of niobium (Nb), molybdenum (Mo), tantalum (Ta), tungsten (W), and bismuth (Bi)) contained in a metal oxyhalide. The third interlayer substance 4 exists between layers of the multilayered graphene 1. The third interlayer substance 4 is a complete oxide, and therefore does not improve conductivity itself of the graphene wiring structure, but exists more stably between layers of the multilayered graphene 1 than a metal halide or a metal oxyhalide. This stability can reduce leakage of the first interlayer substance 2 or the second interlayer substance 3 from between layers of the multilayered graphene 1. That is, the third interlayer substance 4 contributes to improving conductivity of the multilayered graphene 1 by reducing leakage of the first interlayer substance 2 or the second interlayer substance 3. Specifically, a metal oxide of the third interlayer substance 4 is preferably at least one oxide selected from the group consisting of $Nb_2O_5$, $MoO_3$, $Ta_2O_5$, $Bi_2O_3$, and $WO_3$.

In order to form the third interlayer substance 4, it is only required to perform a treatment with an atmosphere having a higher oxidation power at the end of an oxidation step for forming the first interlayer substance 2. For example, in order to obtain the atmosphere having a higher oxidation power, it is only required to perform a treatment with oxygen plasma or to raise a treatment temperature.

When an oxidation treatment is performed, a selected interlayer region may be oxidized by forming a mask. A region in which the third interlayer substance 4 is formed can be thereby selected.

Third Embodiment

Figure 7:
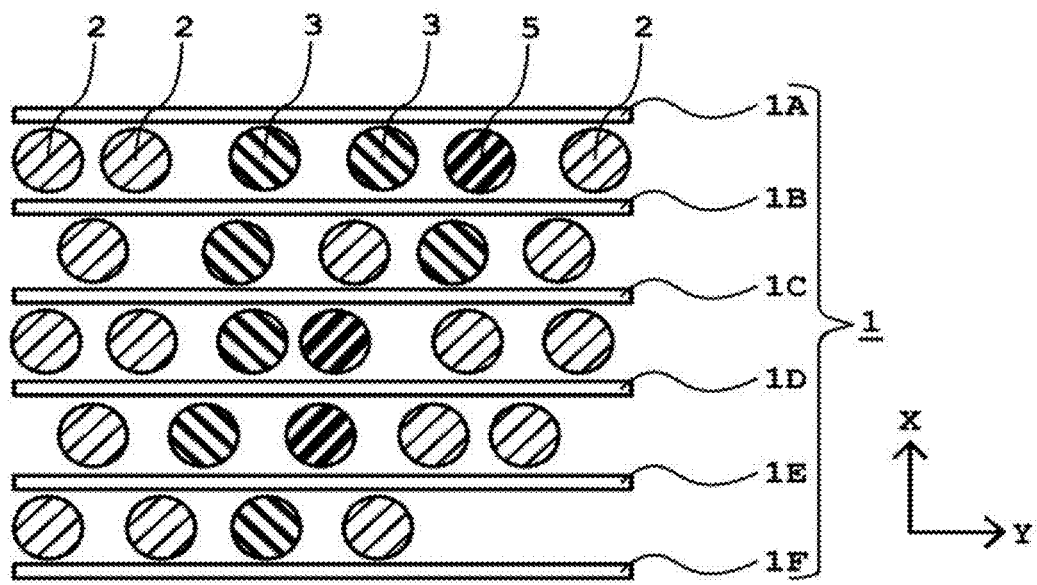
FIG. 7 is a schematic cross-sectional view of a graphene wiring structure according to an embodiment.

A third embodiment is a modified example of the graphene wiring structure of the first embodiment. The graphene wiring structure according to the third embodiment includes a multilayered graphene 1, a first interlayer substance 2 existing between layers of the multilayered graphene 1, a second interlayer substance 3, and a fourth interlayer substance 5. FIG. 7 illustrates a schematic cross-sectional view of the graphene wiring structure according to the third embodiment. The multilayered graphene 1, the first interlayer substance 2, and the second interlayer substance 3 according to the third embodiment are common to those according to the first embodiment, and therefore description thereof will be omitted.

The fourth interlayer substance 5 is at least one compound, metal, or molecule selected from the group consisting of a metal chloride, a metal fluoride, an alkali metal, an alkaline earth metal, a halogen, and an interhalogen compound. The fourth interlayer substance 5 is a compound or a metal to contribute to improving conductivity of the graphene wiring structure. The fourth interlayer substance 5 contributes to improving conductivity of the graphene wiring structure, but easily leaks out from an end between layers of the multilayered graphene 1, a defect of planar graphene sheets, or a grain boundary thereof. However, the first interlayer substance 2 is a stable compound between layers, and therefore suppresses leakage of the fourth interlayer substance 5 in the third embodiment. Existence of the fourth interlayer substance 5 between layers of the multilayered graphene 1 can impart a characteristic such as reduction of resistance to the multilayered graphene 1.

The metal chloride or the metal fluoride in the fourth interlayer substance 5 contains a metal M2 different from a metal M1 contained in the first interlayer substance 2, the second interlayer substance 3, and the third interlayer substance 4. Specific examples of the metal M2 contained in the metal chloride or the metal fluoride include one or more metals selected from the group consisting of iron (Fe), copper (Cu), aluminum (Al), gold (Au), cobalt (Co), nickel (Ni), and antimony (Sb). Examples of the metal chloride containing any metal selected from the group consisting of Fe, Cu, Al, Au, Co, Ni, and Sb include one or more compounds selected from $FeCl_3$, $CuCl_2$, $AlCl_3$, $AuCl_3$, $CoCl_2$, $NiCl_2$, $SbSl_5$, and the like. Specific examples of the metal contained in the metal fluoride include Sb and As. Examples of the metal fluoride containing a metal such as Sb or As include one or more compounds selected from $SbF_5$, $AsF_5$, and the like.

Examples of the alkali metal include one or more metals selected from potassium (K), rubidium (Rb), cesium (Cs), and the like.

Examples of the alkaline earth metal include one or more metals selected from calcium (Ca), strontium (Sr), and the like.

Examples of the halogen include one or more molecules selected from fluorine ($F_2$), chlorine ($Cl_2$), bromine ($Br_2$), iodine ($I_2$), and the like.

Examples of the interhalogen compound include a compound formed from I and another halogen (F, Cl, or Br). More specific examples of the interhalogen compound include one or more compounds selected from IBr, ICl, and the like.

As a method for inserting the fourth interlayer substance 5 between layers of the multilayered graphene 1, for example, it is only required to treat the multilayered graphene 1 with an atmosphere containing the fourth interlayer substance 5.

Fourth Embodiment

Figure 8:
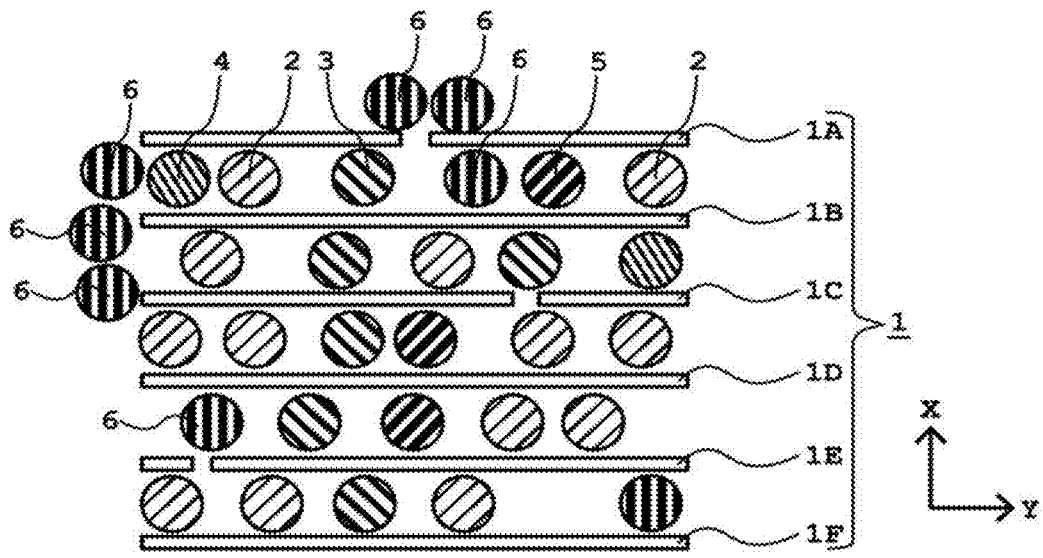
FIG. 8 is a schematic cross-sectional view of a graphene wiring structure according to an embodiment.

A fourth embodiment is a modified example of the graphene wiring structures of the first and second embodiments. The graphene wiring structure according to the fourth embodiment includes a multilayered graphene 1, a first interlayer substance 2 existing between layers of the multilayered graphene 1, a second interlayer substance 3, a fourth interlayer substance 5, and a fifth interlayer substance 6 existing in an outer periphery of the multilayered graphene 1, between layers of the multilayered graphene 1, or in an outer periphery of the multilayered graphene 1 and between layers thereof. FIG. 8 illustrates a schematic cross-sectional view of the graphene wiring structure according to the fourth embodiment. The first interlayer substance 2, the second interlayer substance 3, and the fourth interlayer substance 5 according to the fourth embodiment are common to those according to the first or third embodiment, and therefore description thereof will be omitted.

The multilayered graphene 1 according to the fourth embodiment has polycrystalline planar graphene sheets laminated. A grain boundary or a defect exists in the multilayered graphene 1 according to the fourth embodiment. The multilayered graphenes illustrated in the other embodiments have single crystalline planar graphene sheets laminated. However, in the other embodiments, polycrystalline planar graphene sheets may be used similarly. When a defect or a grain boundary exists in the multilayered graphene 1, oxidation proceeds easily also from the defect or the grain boundary. Therefore, the first interlayer substance 2 and the third interlayer substance 4 exist easily also in a grain boundary region or a defect region. Note that the grain boundary region is a spherical region having a radius of 3 nm from the center of the grain boundary. Note that the defect region is a spherical region having a radius of 3 nm from the center of the defect.

The fifth interlayer substance 6 exists in at least one outer periphery selected from the group consisting of a side surface of the multilayered graphene 1, a top surface thereof, and a bottom surface thereof, between layers of the multilayered graphene 1, or in an outer periphery of the multilayered graphene 1 and between layers thereof. The fifth interlayer substance 6 may exist between layers of the multilayered graphene 1 in the grain boundary region of the multilayered graphene 1 or the defect region thereof. In FIG. 8, the fifth interlayer substance 6 exists on a side surface of the multilayered graphene 1, a top surface of the multilayered graphene 1 (grain boundary region or defect region), and between layers of the multilayered graphene 1. The side surface of the multilayered graphene 1 is a surface constituted by an end of planar graphene sheets and a space therebetween. The top surface of the multilayered graphene 1 is a surface of a planar graphene sheet on the uppermost surface in an opposite direction to a gravity direction. The bottom surface of the multilayered graphene 1 is a surface of a planar graphene sheet on the lowermost surface in a gravity direction. The fifth interlayer substance 6 is preferably at least one selected from the group consisting of a metal oxide, a metal nitride, a metal oxynitride, and a metal carbide. FIG. 8 is illustrated based on assumption that a substrate is disposed on the lowermost surface of the multilayered graphene 1. Therefore, the fifth interlayer substance 6 does not exist on a bottom surface on a side of the lowermost surface of the multilayered graphene 1 in FIG. 8.

Examples of the metal oxide contained in the fifth interlayer substance 6 include a metal oxide formed from oxygen and one or more metals selected from tantalum (Ta), nickel (Ni), titanium (Ti), iron (Fe), molybdenum (Mo), niobium (Nb), bismuth (Bi), chromium (Cr), vanadium (V), hafnium (Hf), cobalt (Co), copper (Cu), silver (Ag), zinc (Zn), tungsten (W), aluminum (Al), zirconium (Zr), manganese (Mn), and the like. Examples of the metal nitride contained in the fifth interlayer substance 6 include a metal nitride formed from oxygen and one or more metals selected from iron (Fe), copper (Cu), aluminum (Al), titanium (Ti), molybdenum (Mo), niobium (Nb), tantalum (Ta), cobalt (Co), antimony (Sb), chromium (Cr), vanadium (V), tungsten (W), silicon (Si), nickel (Ni), zirconium (Zr), and the like. Examples of the metal oxynitride contained in the fifth interlayer substance 6 include a metal oxynitride formed from oxygen and one or more metals selected from hafnium (Hf), titanium (Ti), and the like. Examples of the metal carbide contained in the fifth interlayer substance 6 include a metal carbide formed from oxygen and one or more metals selected from iron (Fe), copper (Cu), aluminum (Al), molybdenum (Mo), cobalt (Co), nickel (Ni), chromium (Cr), vanadium (V), tungsten (W), silicon (Si), titanium (Ti), zirconium (Zr), and the like.

Specific examples of the metal oxide contained in the fifth interlayer substance 6 include one or more compounds selected from $TaO_x$, $NiO_x$, $TiO_x$, $FeO_x$, $MoO_x$, $NbO_x$, $BiO_x$, $CrO_x$, $VO_x$, $HfO_x$, $CoO_x$, $CuO_x$, $AgO_x$, $ZnO_x$, $WO_x$, $AlO_x$, $ZrO_x$, $MnO_x$, and the like. Specific examples of the metal nitride contained in the fifth interlayer substance 6 include one or more compounds selected from $Fe_3N$, $Cu_3N_2$, AlN, MoN, ZrN, and the like. Specific examples of the metal oxynitride contained in the fifth interlayer substance 6 include one or both of HfON and TiON. Specific examples of the metal carbide contained in the fifth interlayer substance 6 include one or more compounds selected from $Fe_3C$, $Cu_2C$, $Al_4C_3$, $Mo_2C$, $Co_2C$, $Ni_3C$, $Cr_3C_2$, VC, WC, SiC, TiC, ZrC, and the like.

The graphene wiring structure containing the fifth interlayer substance 6 according to the fourth embodiment can suppress leakage of an interlayer substance more than those in the above embodiments advantageously.

For example, the fifth interlayer substance 6 is generated by treating a metal contained in a metal oxide, a metal nitride, a metal oxynitride, or a metal carbide with an atmosphere containing any gas selected from the group consisting of an oxidizing gas, a nitriding gas, an oxidizing and nitriding gas, and a carbonizing gas. Note that the fifth interlayer substance 6 can be formed in a selected region. In this case, it is only required to perform a treatment of oxidation, nitridation, oxynitridation, or carbonization using a mask.

Fifth Embodiment

A fifth embodiment is a modified example of the graphene wiring structure of the first embodiment. In the graphene wiring structure illustrated in the schematic cross-sectional view of FIG. 9, a graphene wiring structure is disposed between a first insulating film 7 and a second insulating film 8 on a substrate 11. A first interlayer substance 2 and a second interlayer substance 3 according to the fifth embodiment are common to those according to the other embodiments, and therefore description thereof will be omitted. Description common to the other embodiments for a multilayered graphene 1 or the like will be omitted.

Figure 9:
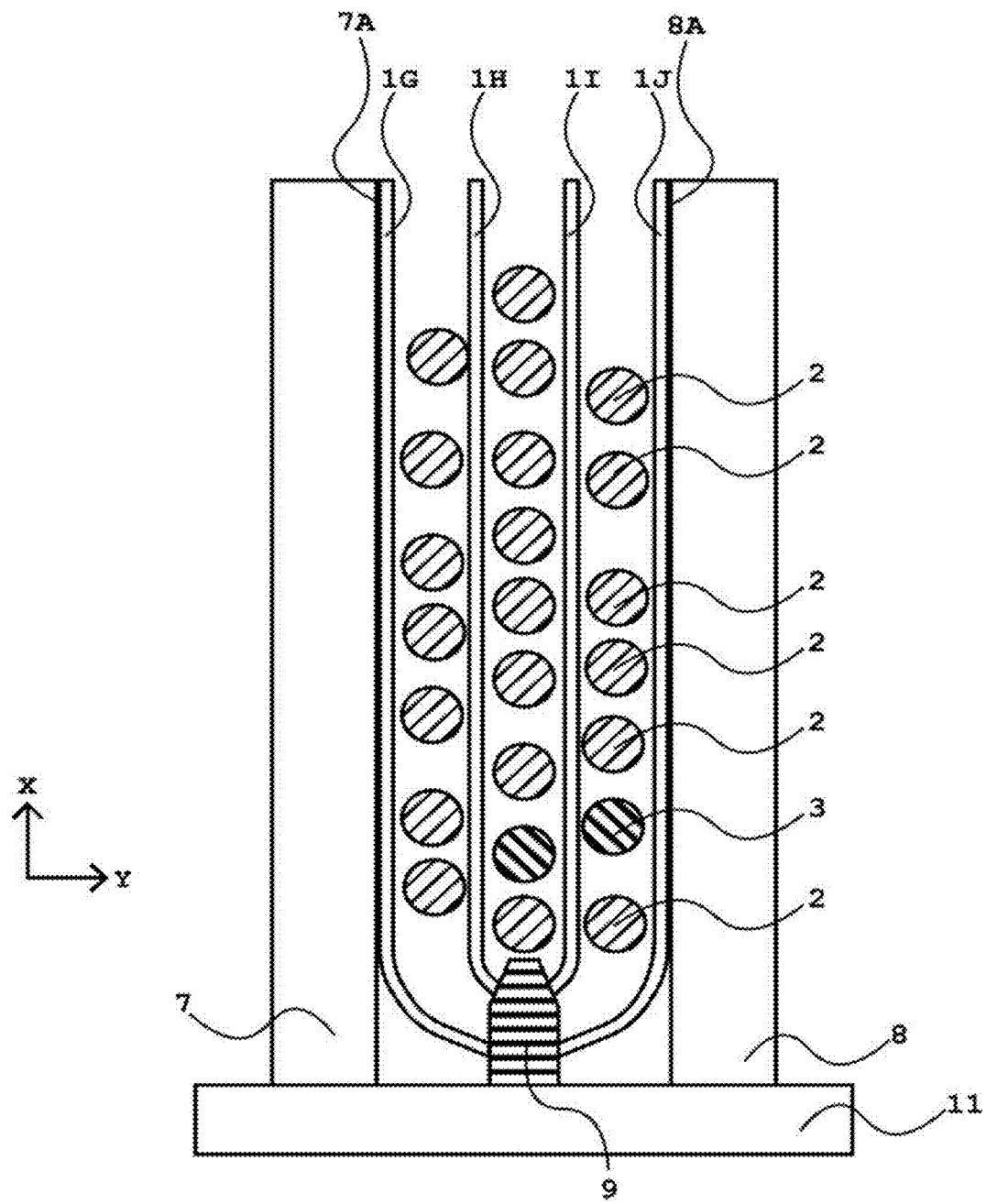
FIG. 9 is a schematic cross-sectional view of a graphene wiring structure according to an embodiment.

The graphene wiring structure illustrated in the schematic cross-sectional view of FIG. 9 includes the substrate 11, a metal portion 9 existing on the substrate 11, the first insulating film 7 existing on the substrate 11, the second insulating film 8 existing on the substrate 11, the multilayered graphene 1 having planar graphene sheets 1G to 1J laminated and existing between the first insulating film 7 and the second insulating film 8, and the first interlayer substance 2 and the second interlayer substance 3 existing between the planar graphene sheets. In FIG. 9, an X direction is a wiring height direction of the graphene wiring structure, and a Y direction is a wiring width direction thereof. In the fifth embodiment, a lamination direction of the planar graphene sheets 1G to 1J is the wiring width direction. Note that a Z direction (not illustrated) perpendicular to an X-Y plane is a wiring length direction of the graphene wiring structure.

Each of the planar graphene sheets 1G to 1J is a graphene sheet grown from the metal portion 9 as a catalyst, and therefore one end (side) thereof is connected to the metal portion 9. In the graphene wiring structure according to the fifth embodiment, one end of a planar graphene sheet constituting the multilayered graphene 1 is connected to the metal portion 9, and the other end is opened. Each of the planar graphene sheets 1G to 1J is preferably a graphene sheet formed by precipitating carbon forming a solid solution in the substrate 11 and the metal portion 9 and derived from a hydrocarbon such as an ethylene gas from the metal portion 9. The planar graphene sheets according to the fifth embodiment are a plurality of laminated graphene sheets partially having a planar shape. The first interlayer substance 2 and the second interlayer substance 3 exist at least between planar portions of graphene sheets.

The metal portion 9 is preferably formed of a metal or an alloy containing Fe, Ta, or Mo. The metal portion 9 exists continuously on the substrate 11 in the Z direction.

The substrate 11 is preferably formed of a member having a hydrocarbon decomposition catalytic property and a carbon solid solution property, such as aluminum oxide ($Al_2O_3$) or titanium oxide ($TiO_2$). All of the metal portion 9, the first insulating film 7, and the second insulating film 8 are disposed on a main surface of the substrate 11. By using these members as the substrate 11, carbon is supplied continuously from the substrate 11 to the metal portion 9 even when carbon precipitated from the metal portion 9 covers the metal portion 9. Therefore, a graphene sheet is grown continuously, and the multilayered graphene 1 having planar portions of graphene sheets laminated can be obtained as illustrated in FIG. 9.

Each of the first insulating film 7 and the second insulating film 8 is an insulating film. The multilayered graphene 1 having planar graphene sheets laminated, and the first interlayer substance 2 and the second interlayer substance 3 existing between layers of the multilayered graphene 1 exist between the first insulating film 7 and the second insulating film 8. The first insulating film 7 has a first main surface 7A which is a side surface perpendicular to the substrate 11 surface. The second insulating film 8 has a second main surface 8A which is a side surface perpendicular to the substrate 11 surface.

Preferably, a planar portion of the graphene sheet 1G on one outermost side of the multilayered graphene 1 faces the first main surface 7A of the first insulating film 7, and the planar portion of the graphene sheet 1G is connected to the first main surface 7A of the first insulating film 7 physically. Preferably, a planar portion of the graphene sheet 1J on the other outermost side of the multilayered graphene 1 faces the second main surface 8A of the second insulating film 8, and the planar portion of the graphene sheet 1J is connected to the second main surface 8A of the second insulating film 8 physically.

The graphene wiring structure according to the fifth embodiment has a different form of the multilayered graphene from the graphene wiring structures according to the first to fourth embodiments, but is common thereto in that the first interlayer substance 2 is stable and contributes to reducing resistance of the multilayered graphene 1. In this way, by existence of the first interlayer substance 2 between layers of the multilayered graphene 1, a stable graphene wiring structure having low resistance can be obtained.

Sixth Embodiment

Figure 10:
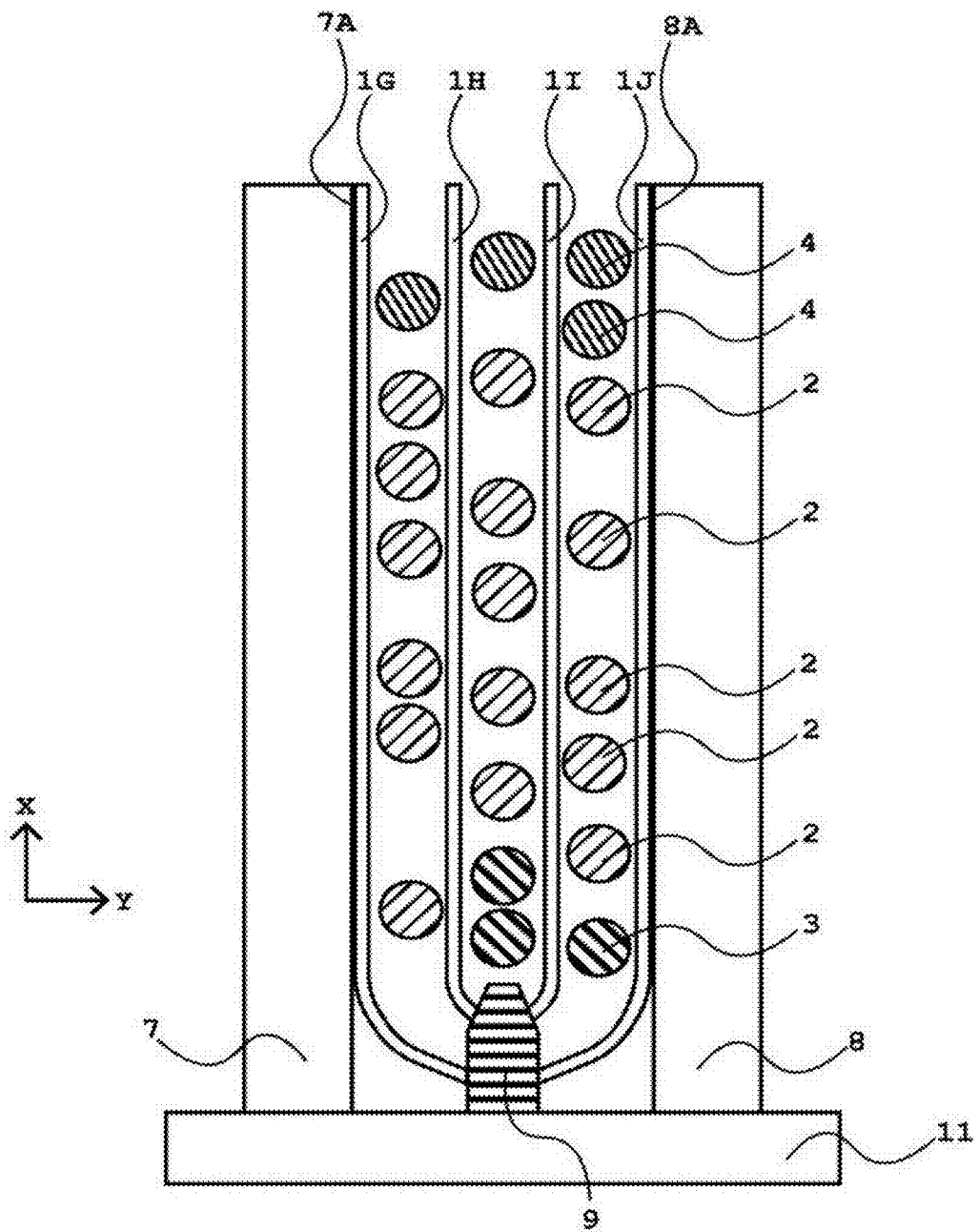
FIG. 10 is a schematic cross-sectional view of a graphene wiring structure according to an embodiment.

A sixth embodiment is a modified example of the graphene wiring structure of the fifth embodiment. FIG. 10 illustrates a schematic cross-sectional view of the graphene wiring structure according to the sixth embodiment. The graphene wiring structure illustrated in the schematic view of FIG. 10 is different from the graphene wiring structure illustrated in the schematic view of FIG. 9 in including a third interlayer substance 4 on a side of an opened end of a multilayered graphene 1.

In the graphene wiring structure according to the sixth embodiment, the third interlayer substance 4 more stable than a first interlayer substance 2 exists on the side of the opened end of the multilayered graphene 1. Therefore, the third interlayer substance 4 acts as a cover of the first interlayer substance 2 and the second interlayer substance 3, and therefore leakage of an interlayer substance can be suppressed more than the graphene wiring structure according to the fifth embodiment advantageously.

EXAMPLES

Figure 11:
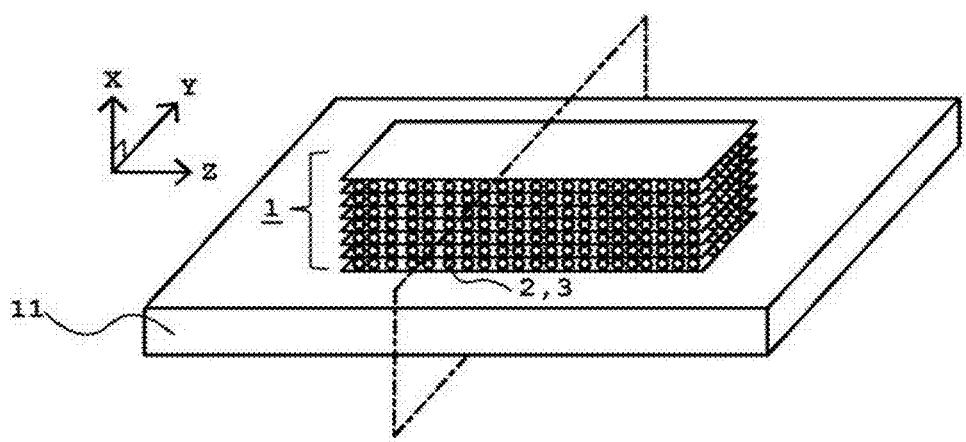
FIG. 11 is a schematic perspective view of a graphene wiring structure according to an Example.

A polycrystalline multilayered graphene 1 is disposed on a $SiO_2$ substrate 11, and is treated with an atmosphere containing molybdenum chloride and an inert gas. Subsequently, the gas is replaced with an atmosphere containing an oxygen gas, and the multilayered graphene 1 which has been treated with molybdenum chloride is oxidized to obtain the graphene wiring structure illustrated in the schematic perspective view of FIG. 11. Then, the graphene wiring structure is coated with a resin 12 so as to cover the graphene wiring structure to prepare a cross section for imaging with a microscope. The schematic perspective view of FIG. 11 illustrates the substrate 11, the multilayered graphene 1 on the substrate 11, the interlayer substances 2 and 3 existing between layers of the multilayered graphene 1, and a virtual plane indicating a cross section observed with an electron microscope, indicated by a broken line.

Figure 12:
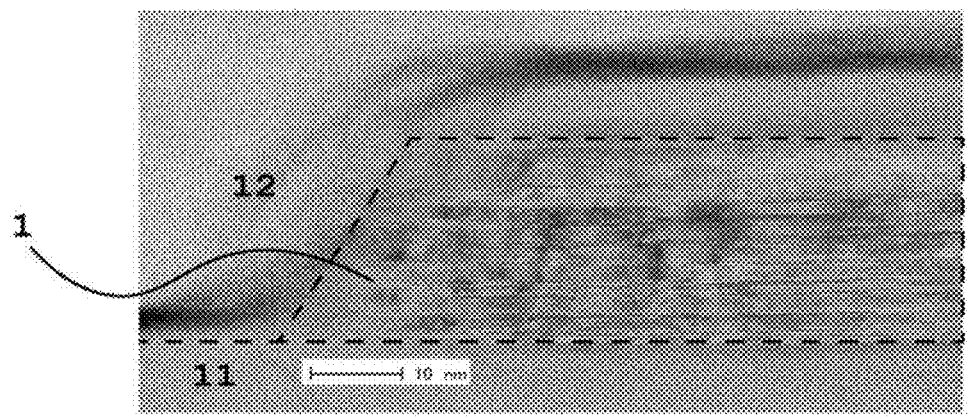
FIG. 12 is an image of a graphene wiring structure according to an Example, photographed by a transmission electron microscope.

Subsequently, the prepared cross section was photographed at a magnification ratio of 2,000,000 times using TEM. FIG. 12 illustrates a TEM image photographed at a magnification ratio of 2,000,000 times. FIG. 12 clearly illustrates the multilayered graphene 1, the substrate 11, and the resin 12 using a broken line. The layered linear portion existing continuously in a lateral direction in FIG. 12 is the multilayered graphene 1 having planar graphene sheets laminated. An irregular black strip-shaped pattern is in a region of the multilayered graphene 1 in FIG. 12. This indicates the interlayer substances 2 and 3 existing between layers of the multilayered graphene 1.

Figure 13A:
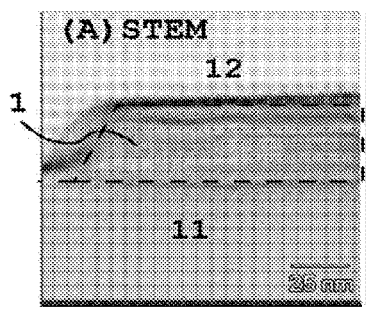
FIG. 13A is an image of a graphene wiring structure according to an Example, photographed by a scanning transmission electron microscope.
Figure 13B:
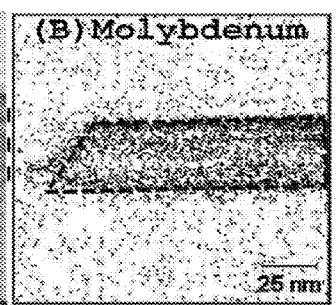
FIG. 13B is an image obtained by mapping molybdenum on the photographed image FIG. 13A.
Figure 13C:
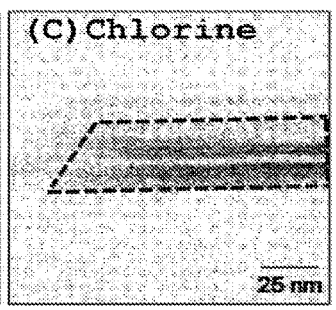
FIG. 13C is an image obtained by mapping chlorine on the photographed image FIG. 13A.
Figure 13D:
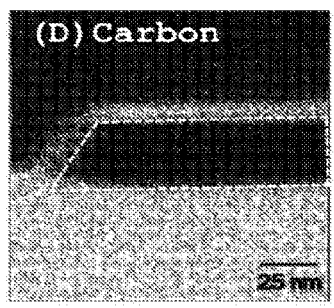
FIG. 13D is an image obtained by mapping carbon on the photographed image FIG. 13A.
Figure 13E:
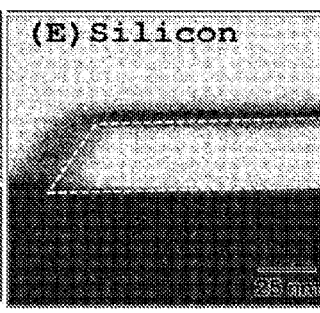
FIG. 13E is an image obtained by mapping silicon on the photographed image FIG. 13A.
Figure 13F:
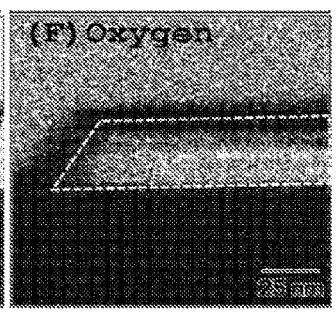
FIG. 13F is an image obtained by mapping oxygen on the photographed image FIG. 13A.

Existence of the interlayer substances 2 and 3 was confirmed between layers of the multilayered graphene 1 with the TEM image. Therefore, in order to identify the interlayer substances 2 and 3, imaging with an electron microscope and element mapping were performed. The prepared cross section sample of the graphene wiring structure was photographed using STEM at a magnification ratio of 1,000,000 times. FIG. 13A illustrates a STEM image which has not been subjected to element mapping. FIG. 13A clearly illustrates the multilayered graphene 1, the substrate 11, and the resin 12 using a broken line. Then, element analysis of molybdenum, chlorine, carbon, silicon, and oxygen was performed by EDX, and mapping was performed. FIG. 13B illustrates an image obtained by mapping molybdenum. FIG. 13C illustrates an image obtained by mapping chlorine. FIG. 13D illustrates an image obtained by mapping carbon. FIG. 13E illustrates an image obtained by mapping silicon. FIG. 13F illustrates an image obtained by mapping oxygen. Note that the black dot region in each of FIGS. 13A to 13F indicates a position where a corresponding element exists. In the images which have been subjected to element mapping, a region of a multilayered graphene 1 is indicated by a broken line.

When the region of the multilayered graphene 1 in the images which have been subjected to element mapping is focused on, it is found that molybdenum, chlorine, carbon, and oxygen exist everywhere therein. This indicates that molybdenum chloride has been partially oxidized by an oxidation treatment to form a metal oxyhalide. If the whole of metal molybdenum has become molybdenum oxide, it cannot be explained that chlorine in FIG. 13C exists everywhere in the region of the multilayered graphene 1. Therefore, it has been confirmed that the multilayered graphene 1 having planar graphene sheets laminated and a metal oxyhalide between layers of the multilayered graphene 1 exist in the region of the multilayered graphene 1. The resin 12 contains carbon, and therefore carbon has been confirmed on a side of the resin 12. $SiO_2$ is used for the substrate 11, and therefore silicon and oxygen have been confirmed on a side of the substrate 11.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene wiring structure, comprising:
   a multilayered graphene having a plurality of planar graphene sheets laminated;
   a first interlayer substance being a metal oxyhalide between the plurality of planar graphene sheets;
   a substrate; and
   a metal portion on the substrate,
   wherein one end of each of the planar graphene sheets is connected to the metal portion.

2. The structure according to claim 1, wherein the metal oxyhalide is at least one compound selected from the group consisting of $NbOCl_3$, $MoOCl_3$, $TaOCl_3$, $WOCl_4$, $BiOCl$, $NbO_2Cl$, $MoO_2Cl$, $TaO_2Cl$, $WO_2Cl_2$, $NbOF_3$, $MoOF_3$, $TaOF_3$, $MoOF_4$, $WOF_4$, $BiOF$, $NbO_2F$, $MoO_2F$, $TaO_2F$, $MoO_2F_2$, and $WO_2F_2$.

3. The structure according to claim 1, wherein the metal oxyhalide includes at least one metal selected from the group consisting of Nb, Mo, Ta, W, and Bi as a metal of the metal oxyhalide.

4. The structure according to claim 1, wherein the substrate comprises a material having a hydrocarbon decomposition catalytic property and a carbon solid solution property.

5. The structure according to claim 1, wherein the multilayered graphene has 10 to 100 of the planar graphene sheets, and has a thickness of from 5 nm to 50 nm.

6. The structure according to claim 1, wherein the first interlayer substance is present between each of the plurality of planar graphene sheets.

7. The structure according to claim 1, wherein the metal oxyhalide is at least one of a metal oxychloride and a metal oxyfluoride.

8. The structure according to claim 1, wherein the other end of each of the planar graphene sheets is not connected to the metal portion.

9. The structure according to claim 1, wherein the metal portion is formed of a metal or an alloy containing Fe, Ta, or Mo.

10. The structure according to claim 1, wherein the substrate comprises aluminum oxide ($Al_2O_3$) or titanium oxide ($TiO_2$).

11. The structure according to claim 1, wherein an interlayer distance between the planar graphene sheets is 0.7 nm to 1.0 nm.

12. The structure according to claim 1, wherein the planar graphene sheets are grown from the metal portion as a catalyst.

13. The structure according to claim 1, further comprising:
   a first insulating film and a second insulating film provided on the substrate such that the multilayered graphene is positioned between the first insulating film and the second insulating film.

14. The structure according to claim 13, wherein the first insulating film has a main surface perpendicular to a surface of the substrate, and the second insulating film has a main surface perpendicular to the surface of the substrate.

15. The structure according to claim 1, further comprising a third interlayer substance between the plurality of planar graphene sheets, wherein the third interlayer substance is an oxide of a metal contained in the metal oxyhalide.

16. The structure according to claim 15, wherein the first interlayer substance, the second interlayer substance, and the third interlayer substance are present between each of the plurality of planar graphene sheets.

17. The structure according to claim 1, further comprising a second interlayer substance between the plurality of planar graphene sheets, wherein the second interlayer substance is a halide of a metal contained in the metal oxyhalide.

18. The structure according to claim 17, wherein the first interlayer substance and the second interlayer sub stance are present between each of the plurality of planar graphene sheets.

\* \* \* \* \*